(12) United States Patent
Ogura

(10) Patent No.: US 8,401,390 B2
(45) Date of Patent: Mar. 19, 2013

(54) OPTICAL CONNECTING APPARATUS

(75) Inventor: Ichiro Ogura, Tokyo (JP)

(73) Assignee: NEC Corporation, Tokyo (JP)

( * ) Notice: Subject to any disclaimer, the term of this patent is extended or adjusted under 35 U.S.C. 154(b) by 771 days.

(21) Appl. No.: 12/528,927

(22) PCT Filed: Feb. 13, 2008

(86) PCT No.: PCT/JP2008/052298
§ 371 (c)(1),
(2), (4) Date: Aug. 27, 2009

(87) PCT Pub. No.: WO2008/108142
PCT Pub. Date: Sep. 12, 2008

(65) Prior Publication Data
US 2010/0104289 A1     Apr. 29, 2010

(30) Foreign Application Priority Data

Mar. 6, 2007   (JP) ................................ 2007-055831

(51) Int. Cl.
H04J 14/02     (2006.01)
G02B 6/12     (2006.01)

(52) U.S. Cl. .......................................... 398/82; 385/14

(58) Field of Classification Search .................... 398/79, 398/82; 385/14
See application file for complete search history.

(56) References Cited

U.S. PATENT DOCUMENTS 6,124,960 A * 9/2000 Garthe et al. ................. 398/194

(Continued)

FOREIGN PATENT DOCUMENTS

JP    05-067770 A    3/1993
JP    05-333396 A   12/1993

(Continued)

OTHER PUBLICATIONS

Nagarajan et al. 400 Gbit/s (10 channel X 40 Gbit/s) DWDM Photonic Integrated Circuits. Electronics Letters, vol. 41, Mar. 17, 2005 [online], [retrieved on May 14, 2012]. Retrieved from the Internet <URL: http://ieeexplore.ieee.org/stamp/stamp.jsp?arnumber=01421191>.*

(Continued)

*Primary Examiner* — Nathan Curs
(74) *Attorney, Agent, or Firm* — Dickstein Shapiro LLP

(57) ABSTRACT

An optical connecting apparatus has a light source outputting an optical signal indicating a plurality of wavelengths which correspond to a plurality of transmission channels, an optical transmit section and an optical receive section being mounted with integrated circuits and being connected to each other through an optical line of a single system, and a signal conversion section being inlet in the optical line and converting a phase modulated signal into an intensity modulated signal. The optical transmit section includes: a demultiplexer which separates the optical signal from the light source according to the transmission channels; an optical modulator unit which generates phase modulated signals by implementing phase modulation with optical signals from the demultiplexer by using a plurality of optical modulators whose operations are synchronized by a signal from the integrated circuit; and a multiplexer which multiplexes the phase modulated signals from the optical modulator unit and outputs the multiplexed phase modulated signals to the signal conversion section through the optical line. The optical receive section includes: a demultiplexer which separates the intensity modulated signal from the signal conversion section according to the transmission channels; and an optical receiver unit which converts the intensity modulated signals from the demultiplexer into electric signals.

8 Claims, 3 Drawing Sheets

U.S. PATENT DOCUMENTS

| | | | |
|---|---|---|---|
| 6,845,184 B1 | 1/2005 | Yoshimura et al. | |
| 7,116,917 B2 | 10/2006 | Miyamoto et al. | |
| 7,292,744 B2 | 11/2007 | Ouchi | |
| 2003/0067649 A1* | 4/2003 | Suzuki et al. | 359/124 |
| 2005/0013618 A1 | 1/2005 | Kurebayashi | |

FOREIGN PATENT DOCUMENTS

| | | |
|---|---|---|
| JP | 07-079212 A | 3/1995 |
| JP | 2000-059300 A | 2/2000 |
| JP | 2000-114581 A | 4/2000 |
| JP | 2000-201106 A | 7/2000 |
| JP | 2002-031786 A | 1/2002 |
| JP | 2003-087201 A | 3/2003 |
| JP | 2003-309520 A | 10/2003 |
| JP | 2004-274155 A | 9/2004 |
| JP | 2004-533163 A | 10/2004 |
| JP | 2005-039493 A | 2/2005 |

OTHER PUBLICATIONS

Yuzu Ishii et al.; "SMT-Compatible Optical-I/O Chip Packaging for Chip-Level Optical Interconnects"; Electronic Components and Technology Conference 2001, p. 870.

* cited by examiner

OPTICAL CONNECTING APPARATUS

TECHNICAL FIELD

The present invention relates to an optical connecting apparatus for connection of many signals such as a signal transmitting device between LSIs and a backplane of a device.

BACKGROUND ART

In an advanced information society, there is a demand for the increased capabilities of an information processing device such as a server and a network device such as a router. To meet this demand, it is considered effective to miniaturize LSIs to increase the degree of integration and the degree of integration is expected to steadily increase in the future.

However, while the degree of integration increases, the density of LSI package's signal pins which input and output signals does not increase, thereby preventing an increase in capability. The problem is a so-called "pin bottleneck."

To solve the above-mentioned pin bottleneck, an attempt is being made to increase the speed of transmitting signals per pin by multiplexing a plurality of signals (parallel-to-serial conversion) inside LSI. Owing to the multiplexing technique, transmission speed has increased to around 10 Gbps. The increased speed, however, cause various problems. For example, transmission loss increases due to skin effect on the lines of a circuit board. In this case, because of the deterioration of transmission characteristics, an additional circuit such as a waveform correction circuit is necessary to improve transmission characteristics even for transmission of several dozen centimeters. As a result, problems that circuits become complex and power consumption increases are brought.

To solve the above-mentioned problems, an optical connection technique is being developed to convert the output of LSI into an optical beam before transmission. The optical connection of high-speed signals at around 10 Gbps has been primarily used between bodies of large-scale devices. This sort of connection is expected to be used for among cards inside devices, for backplanes, and for wiring between LSIs on a board in the future.

Moreover, as a technique for realizing optical connection between LSIs, a technique of forming an optical waveguide on an optical electronic integrated structure where LSIs and photoelectric conversion devices are integrated or an electrical circuit board is increasingly examined. Research and development on the technique has been conducted worldwide particularly as a surface emitting laser, which is small and can be arrayed, is put to practical use.

For example, an optical electronic integrated structure where optical waveguides, photoelectric conversion elements and LSIs are integrated and information is exchanged therebetween is disclosed in NPL 1 described later. FIG. 3 shows the configuration of the optical electronic integrated structure disclosed in the literature.

The optical electronic integrated structure shown in FIG. 3 is a structure where a LSI 105, an photoelectric conversion device, and a driver IC which drives the optical device are integrated on an interposer 106. In the structure, a transmitting section on the left side of the diagram converts an output signal of the LSI 105 into an optical signal at a surface emitting laser array (VCSEL array) 103, and transmits the optical signal through a polymer waveguide 102 formed on a printed-circuit board (PCB) 101. A receiving section on the right side of the diagram converts the optical signal from the transmitting section into an electric signal using a photodiode array (PD array) 104, which is a light receiving element, and inputs the electric signal into the LSI 105.

Moreover, techniques for transmitting information using similar optical electronic integrated structures to the one shown in FIG. 1 are disclosed in PTLs 1, 2, 3 and 4 described later.

[Citation List]
[Patent Literature]
  [PTL 1] JP-A-2000-114581
  [PTL 2] JP-A-2004-274155
  [PTL 3] JP-A-05-333396
  [PTL 4] JP-A-05-067770
  [PTL 5] JP-A-2003-309520
[Non Patent Literature]
  [NPL 1] Ishii et al., "SMT-Compatible optical-I/O Chip Packaging for Chip-Level Optical Interconnects", Electronic Components and Technology Conference 2001, p. 870

SUMMARY OF INVENTION

Technical Problem

In general, the number of signal lines is enormous: the number of signal lines of a backplane is several hundreds, and the number of signal lines between the LSIs is several hundreds to more than one thousand. If there is a large number of optical lines as described above, a conventional system used in optical communication, such as a system where optical beam from a semiconductor laser is modulated and output to allow an optical receiver to receive the optical beam, causes the following problems.

For realizing a large number of optical lines, semiconductor lasers and drive circuits need to be densely mounted around LSI. The semiconductor lasers, however, are sensitive to ambient temperatures. Accordingly, the semiconductor laser disposed near the LSI which radiates a large amount of heat brings deterioration of operating characteristics of the lasers, such as a decline in emission intensity, and a decline in reliability.

Even with a system in which a optical modulator is used, which is for example a light-intensity modulation system in which a Mach-Zehnder optical interferometer is used, differences occur between operational conditions of the interferometer due to heat, resulting in instability in modulation characteristic.

The present invention has been made in view of the above-mentioned problems, and the object thereof is to provide an optical connecting apparatus which is rarely affected by the generation of heat by the LSI.

Solution to Problem

According to the present invention, an optical connecting apparatus includes: a light source outputting an optical signal indicating a plurality of wavelengths which correspond to a plurality of transmission channels; an optical transmit section and an optical receive section being mounted with integrated circuits and being connected to each other through an optical line of a single system; and a signal conversion section being inlet in the optical line and converting a phase modulated signal into an intensity modulated signal, wherein the optical transmit section includes: a demultiplexer which separates the optical signal from the light source according to the transmission channels; an optical modulator unit which generates phase modulated signals by implementing phase modulation with optical signals from the demultiplexer by using a plurality of optical modulators whose operations are synchronized by a signal from the integrated circuit; and a multiplexer which multiplexes the phase modulated signals from the optical modulator unit and outputs the multiplexed phase modulated signals to the signal conversion section through the optical line, and the optical receive section includes: a demultiplexer which separates the intensity modulated signal from the signal conversion section according to the transmission channels; and an optical receiver unit which converts the intensity modulated signals from the demultiplexer into electric signals.

Advantageous Effects of Invention

According to the present invention, while it is possible to implement high-density optical wiring nearby integrated circuits, it is possible to locate the signal conversion section away from the optical transmit section and the optical receive section on which the integrated circuits are mounted. Therefore, the effect of heat from the integrated circuits to the signal conversion section can be mitigated, thereby optical connection can be stable.

REFERENCE SIGNS LIST

Figure 1:
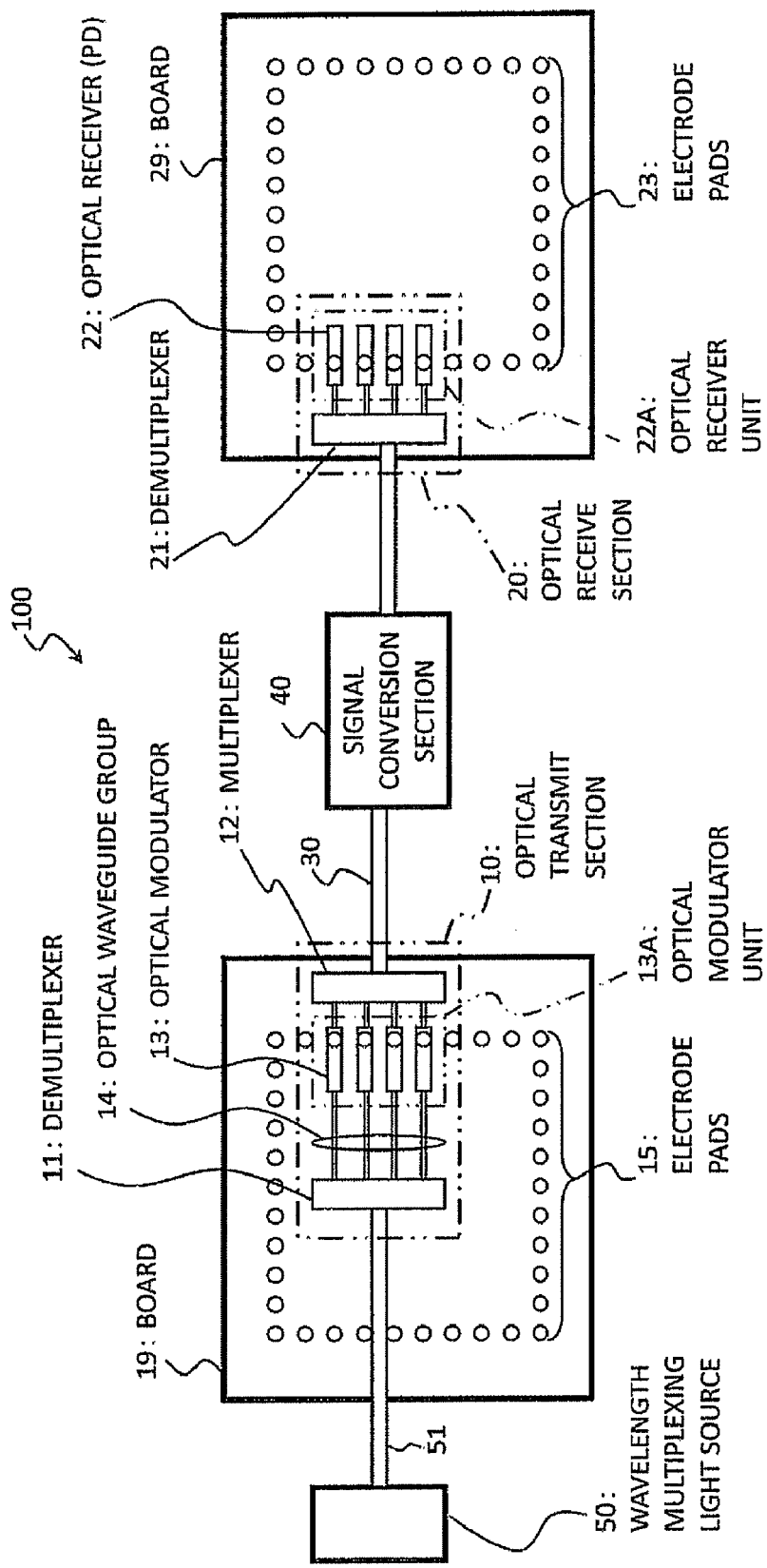
FIG. 1 is a diagram illustrating the configuration of an optical connecting apparatus according to an embodiment of the present invention.

100: Optical connecting apparatus
10: Optical transmit section
11, 21: Demultiplexer
12: Multiplexer
13: Optical modulator
13A: Optical modulator unit
14: Optical waveguide group
15, 23: Electrode pad
16: LSI
17: Electric line
18: Solder bump
19, 29: Board
20: Optical receive section
22: Optical receiver
22A: Optical receiver unit
30: Optical wiring section
40: Signal conversion section
50: Wavelength multiplexing light source
51: Optical waveguide

DESCRIPTION OF EMBODIMENTS

<Configuration>

FIG. 1 shows the configuration of an optical connecting apparatus 100 according to an embodiment of the present invention. The optical connecting apparatus 100 includes a wavelength multiplexing light source 50 which outputs optical beams the wavelengths of which respectively correspond to a plurality of transmission channels; an optical transmit section 10 which is formed on a board 19; an optical receive section 20 which is formed on a board 29; and a signal conversion section 40 which is inlet in an optical wiring section 30. The optical wiring section 30 provides an optical line of a single system between the optical transmit section 10 and the optical receive section 20. The optical wiring section 30 may consist of an optical fiber or an optical waveguide.

LSIs (not shown in FIG. 1) that output single-frequency signals are respectively mounted on the boards 19 and 29. The LSIs are electrically connected to the boards (19 and 29) through electrode pads 15 and electrode pads 23, respectively.

As shown in FIG. 1, the optical transmit section 10 includes a demultiplexer 11, a multiplexer 12, an optical modulator unit 13A, and an optical waveguide group 14. The optical waveguide group 14 includes a plurality of optical waveguides formed on the board 19. Each of the optical waveguides correspond to a different transmission channel.

The demultiplexer 11 separates the optical beams, input by an optical fiber or an optical waveguide as an optical introduction path 51, from the wavelength multiplexing light source 50 into optical beams. The separated optical beams indicate different wavelengths from each other and respectively correspond to the transmission channels. The demultiplexer 11 supplies each of the optical beams to the corresponding optical waveguide of the optical waveguide group 14.

The optical modulator unit 13A consists a plurality of optical modulators 13 which are connected to the optical waveguides of the optical waveguide group 14 and are arranged in array. Each of the optical modulators 13 is a phase modulator whose refractive index varies according to the applied voltage. The modulation method thereof is a differential phase difference modulation method according to which the difference between the transmission information at a certain operational timing and the transmission information at the immediately preceding operational timing is output as a phase difference. The differential phase difference modulation method is generally known in the field of optical communication, and the relevant technology is for example disclosed in TPL 5.

The multiplexer 12 bundles the phase modulated signals of each channel, which are modulated by the optical modulator unit 13A, to one. In other words, the multiplexer 12 implements a wavelength multiplexing with a plurality of optical signals from the optical modulator unit 13A. Then, the multiplexed signal are output to the signal conversion section 40 through the optical wiring section 30.

The signal conversion section 40 converts the phase modulated signal from the optical transmit section 10 into intensity modulated signal. The signal conversion section 40 may be a so-called one bit shift interferometer. This one bit shift interferometer is a Mach-Zehnder interferometer whose two arms have therebetween a time difference equivalent to one bit of information. The intensity modulated signal output from the signal conversion section 40 is supplied by the optical wiring section 30 to the optical receive section 20.

As shown in FIG. 1, the optical receive section 20 includes a demultiplexer 21, and an optical receiver unit 22A which includes a plurality of optical receivers (PDs: Photodetectors) 22 arranged in array. The demultiplexer 21 supplies the intensity modulated signal supplied by the optical wiring section 30 from the signal conversion section 40 to the corresponding optical receivers 22. Each optical receiver 22 of the optical receiver unit 22A converts the input intensity modulated signal into an electric signal.

Figure 2:
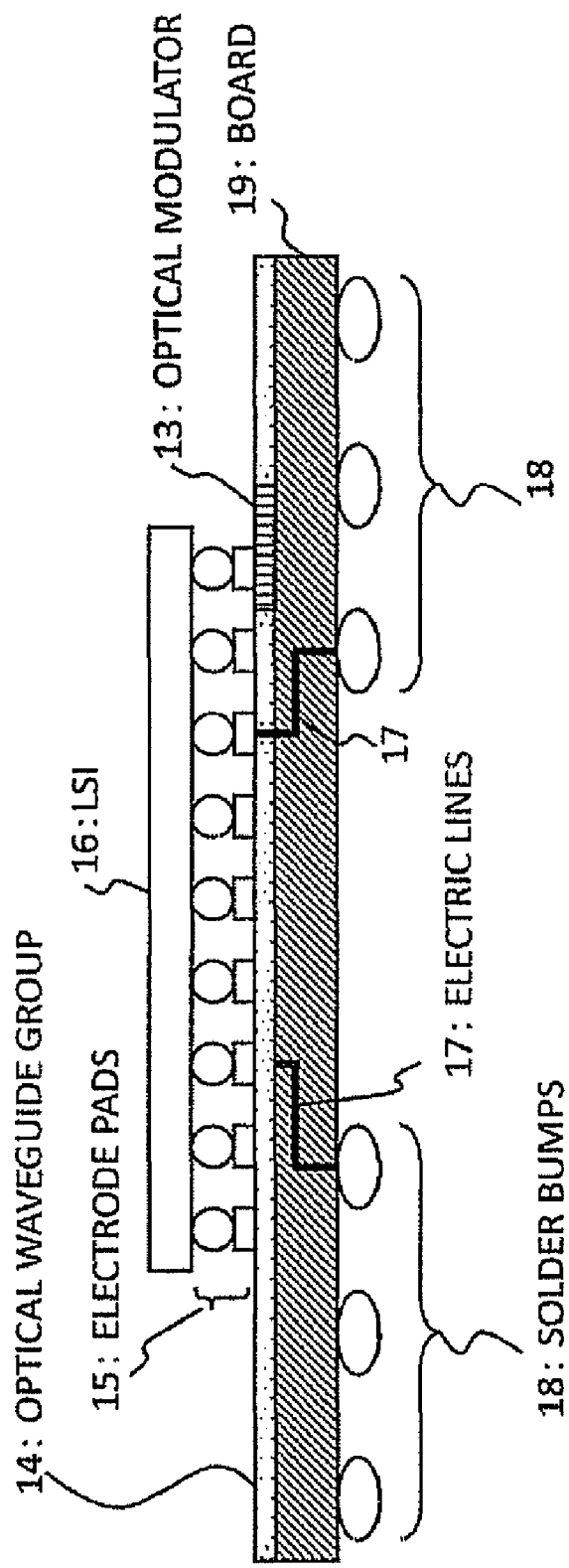
FIG. 2 is a partial cross section diagram illustrating how the optical connecting apparatus and LSI are connected according to the embodiment of the present invention.
Figure 3:
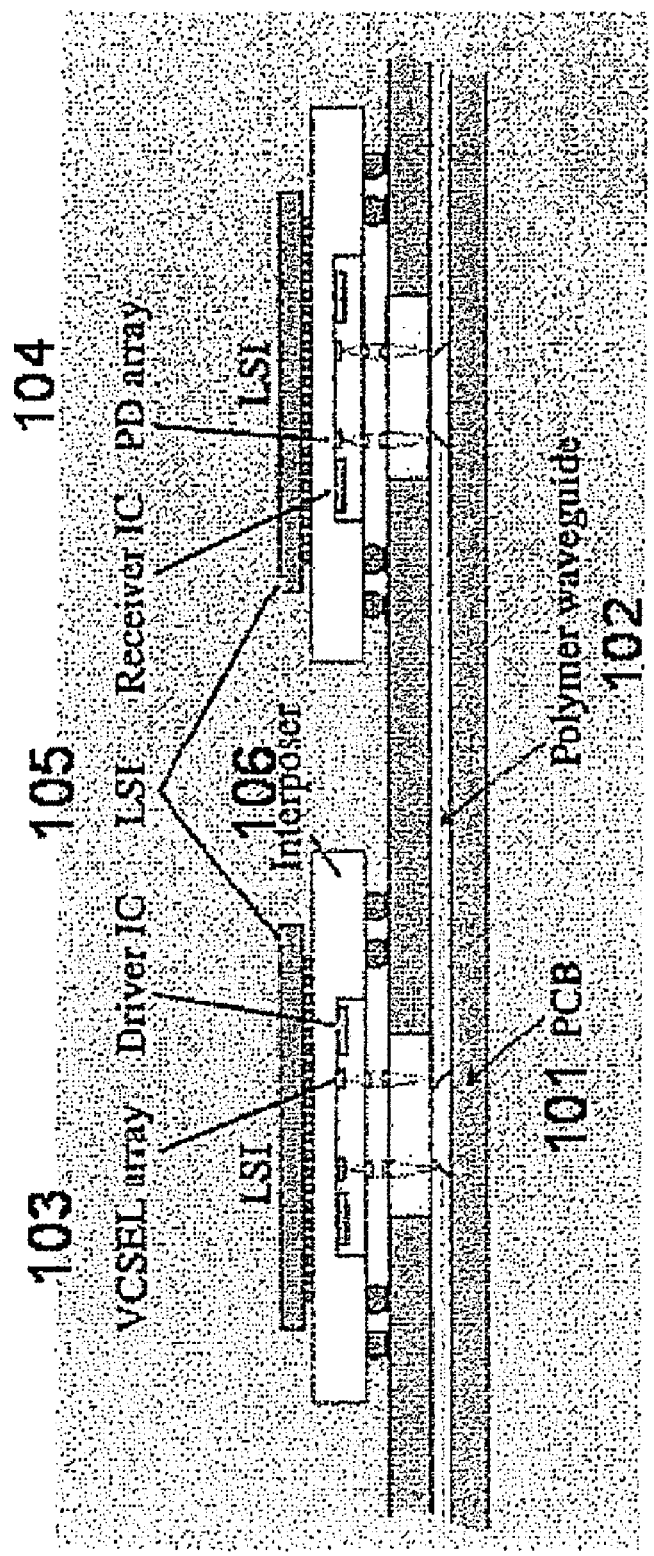
FIG. 3 is an explanatory diagram illustrating an optical electronic integrated structure disclosed in NPL 1.

FIG. 2 is a partial cross section diagram illustrating how the optical modulator unit 13A of the optical transmit section 10 and LSI are connected. As described above, the optical waveguide group 14 and the optical modulator 13 are formed on the board 19. A LSI 16 is mounted on the board 19 through the electrode pads 15. The electrode pads 15 are short-circuited through electric lines 17 formed on the board 19 to solder bumps 18 on the back side of the board 19.

The optical modulators 13 are electrically connected to a signal output section (not shown in the diagram) of the LSI 16 through the electrode pads 15, and are driven by the output signals of the LSI 16. Moreover, the optical modulators 13 modulate the optical beam of a specific wavelength input through the optical waveguides of the optical waveguide group 14. The optical signals modulated by the optical modulators 13 are output to the multiplexer 12 (FIG. 1) through the optical waveguides.

The number of wavelengths used in the optical connecting apparatus 100 having the above-described configuration is determined according to the number of signal channels of the LSI, the type of the light source, the capabilities of the multiplexer 12 and the demultiplexer 11, and the like. Like the present embodiment, a generally-known arrayed waveguide grating may be used as the multiplexer 12 and the demultiplexer 11 to carry out the multiplexing and demultiplexing of several dozen wavelengths.

The wavelength multiplexing light source 50 may consists, for example, the same number of semiconductor lasers as sort of wavelengths used in the optical connecting apparatus 100. A device which generates at once multiple wavelengths such as a super-continuum beam, frequency combs, and a multi-mode transmission laser may be used as the wavelength multiplexing light source 50. In the latter case, it is possible to supply several dozen to several hundred wavelengths of optical beams.

If the stability of wavelengths is guaranteed by the temperature management of the wavelength multiplexing light source 50, about 30 wavelengths can be handled. Moreover, if it is difficult to carry out the management of wavelengths, about 8 wavelengths can be handled, and, in this case, the practical configuration is designed to enlarge intervals between wavelengths. Incidentally, if there is a large number of signals of the LSI, for example several hundreds to one thousand lines, a plurality of configurations of the present embodiment may be prepared and used as one optical connecting apparatus.

Materials such as ceramics, which are relatively less affected by a change in temperature, are appropriately selected for the optical modulators 13 of the optical modulator unit 13A, thereby preventing a dramatic change in modulation characteristics even if ambient temperatures change.

Specifically, lithium niobate or an EO crystal like PLZT, which have the electro-optic effect, or EO polymeric materials can be used for the optical modulators 13. In addition, the refractive index modulation that makes use of the carrier density of the semiconductor may be used for the optical modulators 13. Since the materials of the optical modulators 13 are appropriately selected, the deterioration of the operating characteristics caused by a rise in temperature due to the semiconductor lasers, and a decline in reliability are prevented.

<Operation>

By reference of FIGS. 1 and 2, the operation of the optical connecting apparatus 100 will be described. The optical connecting apparatus 100 uses the arrayed optical modulator unit 13A, which is integrated in the optical waveguide group 14, to carry out the differential phase difference modulation at substantially the same density as that of the signal pins of the LSI 16.

Since the optical modulator unit 13A is driven by the single-frequency signals from the LSI 16, the optical modulators 13 are in synchronization with each other in terms of operational timing. By the differential phase difference modulation of the optical modulator unit 13A, the difference between the signals that appear before and after the operation timing is calculated for each channel, and the difference is obtained as a phase difference of the two signals.

By the wavelength multiplexing, the optical connecting apparatus 100 transmits the optical signals the wavelengths of which are different from each other and respectively correspond to the transmission channels using the optical waveguide group 14. The optical connecting apparatus 100 bundles the phase difference signals of each channel, which have passed through the above-described optical modulator unit 13A by using the multiplexer 12, and outputs the bundled signal to the single optical line (30). The output phase difference signal are converted by the one bit shift interferometer of the signal conversion section 40 inlet in the optical wiring section 30 into the intensity modulated signal.

In that manner, the optical transmit section 10 performs phase difference modulation of the optical signals of all the channels at the same timing and outputs. Therefore, the phase difference signals of all the channels are collectively converted by a single interferometer (40) into the intensity modulated signal.

The intensity modulated signal output from the signal conversion section 40 is separated by the demultiplexer 21 of the optical receive section 20 into the optical signals the wavelengths of which respectively correspond to the channels. The separated optical signals are respectively input into the corresponding optical receivers 22 of the optical receiver unit 22A. Then, each of the optical receivers 22 converts the input optical signals into the electric signals and outputs the electric signals.

As described above, the optical connecting apparatus 100 modulates the optical signals of all the transmission channels at the same timing using the optical transmit section 10 and then outputs. Then, a single interferometer (40) collectively converts the signals of all the channels into the intensity modulated signal.

Therefore, according to the present embodiment, while high-density optical wiring is possible around the LSI, the signal conversion section 40 can be positioned a distance away from the optical transmit and optical receive sections 10 and 20 on which the LSIs are mounted, thereby reducing the effect of heat of the LSIs on the interferometer (40).

INDUSTRIAL APPLICABILITY

The present invention can be applied, for example, to a backplane inside a device such as a computer and a network device, or for signal transmission inside a board.

The invention claimed is:

1. An optical connecting apparatus comprising:
a light source outputting an optical signal indicating a plurality of wavelengths which correspond to a plurality of transmission channels;
an optical transmission section and an optical reception section being mounted with integrated circuits and being connected to each other through an optical line; and
a signal converter disposed between the optical transmission section and the optical reception section and connected to the respective sections through the optical line, and configured to convert a phase modulated signal into an intensity modulated signal according to transmission information modulated on the phase modulated signal, wherein
the optical transmission section includes: an optical modulator unit which generates the phase modulated signal by implementing phase modulation with optical signals from the light sources, each which has a different wavelength, by using a plurality of optical modulators; and a multiplexer which multiplexes the phase modulated signals from the optical modulator unit and outputs the multiplexed phase modulated signals to the signal converter through the optical line, and the optical reception section includes: a demultiplexer which separates the intensity modulated signal from the signal converter according to the transmission channels; and an optical reception unit which converts the intensity modulated signals from the demultiplexer into electric signals.

2. The optical connecting apparatus according to claim 1, wherein each of the optical modulators of the optical modulator unit of the optical transmission section modulates the optical signals by differential phase difference modulation and outputs the modulated signal, and the signal converter converts the modulated signal from the optical transmission section into the intensity modulated signal by using an optical interferometer whose a pair of optical paths have therebetween a time difference equivalent to one bit of a signal.

3. The optical connecting apparatus according to claim 1, wherein the plurality of optical modulators of the optical modulator unit are connected to an optical waveguide group formed on a board and are arranged in array.

4. The optical connecting apparatus according to claim 1, wherein the light source comprises the same number of semiconductor laser devices as the transmission channels.

5. The optical connecting apparatus according to claim 1, wherein the light source comprises a laser device which collectively outputs a optical signal indicating wavelengths which correspond to the plurality of transmission channels.

6. The optical connecting apparatus according to claim 1, wherein the optical line is an optical fiber or an optical waveguide formed on a board.

7. The optical connecting apparatus according to claim 1, wherein the optical transmission section includes a demultiplexer which separates the optical signal from the light source according to the transmission channels.

8. The optical connecting apparatus according to claim 1, wherein the operations of the plurality of optical modulators are synchronized with each other by a single-frequency signal from the integrated circuit.

* * * * *